(12) United States Patent
Voldman

(10) Patent No.: US 6,404,269 B1
(45) Date of Patent: *Jun. 11, 2002

(54) LOW POWER SOI ESD BUFFER DRIVER NETWORKS HAVING DYNAMIC THRESHOLD MOSFETS

(75) Inventor: Steven H. Voldman, South Burlington, VT (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/398,594

(22) Filed: Sep. 17, 1999

(51) Int. Cl.$^7$ ................................. H03K 3/01
(52) U.S. Cl. ...................... 327/534; 327/537
(58) Field of Search ............... 327/112, 530, 327/534, 535, 537, 427, 434, 436, 437, 108

(56) References Cited

U.S. PATENT DOCUMENTS

| | | | |
|---|---|---|---|
| 4,256,977 A | * 3/1981 | Hendrickson | 327/434 |
| 5,103,277 A | 4/1992 | Caviglia et al. | 257/348 |
| 5,262,689 A | * 11/1993 | Glica et al. | 327/108 |
| 5,321,293 A | 6/1994 | Mojardi et al. | 327/534 |
| 5,377,094 A | * 12/1994 | Williams et al. | 327/436 |
| 5,434,526 A | * 7/1995 | Tanigashira et al. | 327/534 |
| 5,459,654 A | * 10/1995 | Williams et al. | 327/108 |
| 5,510,747 A | * 4/1996 | Williams | 327/434 |
| 5,557,231 A | 9/1996 | Yamaguchi et al. | 327/534 |
| 5,594,371 A | 1/1997 | Douseki | 326/83 |
| 5,596,297 A | * 1/1997 | McClure et al. | 327/530 |
| 5,610,533 A | 3/1997 | Arimoto et al. | 327/537 |
| 5,682,050 A | * 10/1997 | Williams | 327/537 |
| 5,689,209 A | * 11/1997 | Williams et al. | 327/534 |
| 5,748,016 A | 5/1998 | Kurosawa | 327/108 |
| 5,767,733 A | * 6/1998 | Grugett | 327/534 |
| 5,811,857 A | * 9/1998 | Assaderaghi et al. | 257/355 |
| 5,814,899 A | 9/1998 | Okumura et al. | 327/534 |
| 5,829,260 A | 11/1998 | Kojima et al. | 62/148 |
| 5,838,047 A | 11/1998 | Yamauchi et al. | 327/537 |
| 5,892,260 A | 4/1999 | Okumura et al. | 327/534 |
| 5,917,365 A | * 6/1999 | Houston | 327/534 |
| 6,094,068 A | * 7/2000 | Nomura et al. | 327/534 |
| 6,107,865 A | * 8/2000 | Brady | 327/537 |
| 6,111,455 A | * 8/2000 | Eleyan et al. | 327/534 |

* cited by examiner

Primary Examiner—Toan Tran
Assistant Examiner—Long Nguyen
(74) Attorney, Agent, or Firm—McGinn & Gibb, PLLC; Richard A. Henkler, Esq.

(57) ABSTRACT

A method and structure for a body coupled driver circuit includes a pull-up stage having a first transistor and a pull-down stage having a second transistor. The first transistor and the second transistor have bodies coupled to either a reference voltage or a pad node.

36 Claims, 7 Drawing Sheets

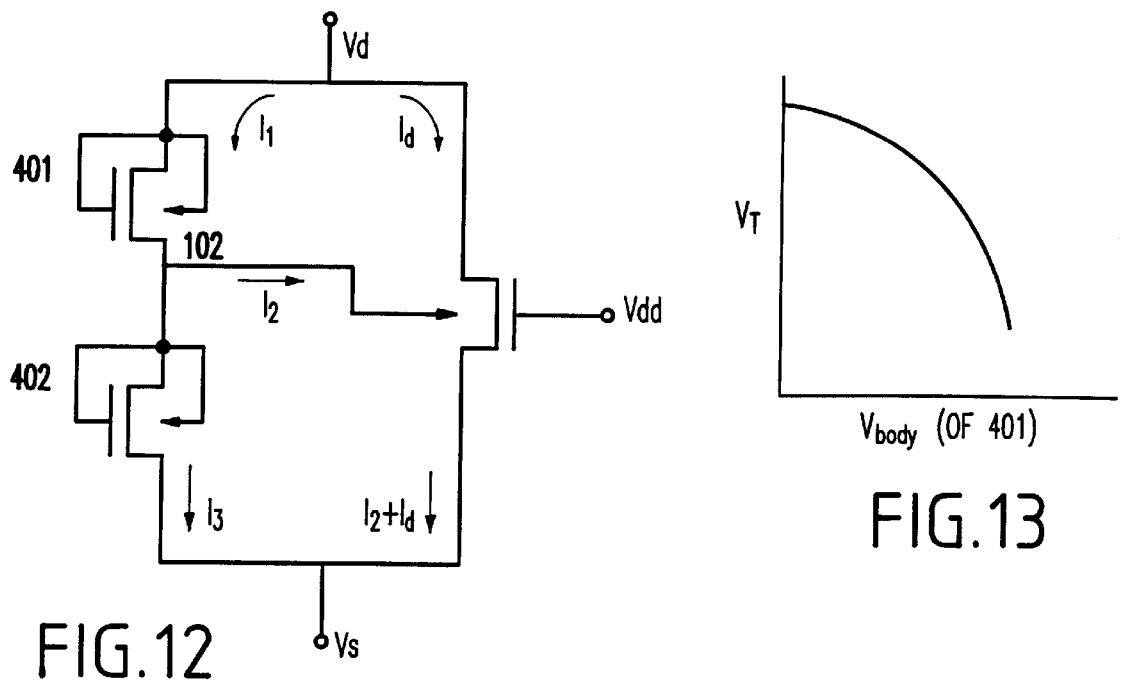
FIG.12
FIG.13
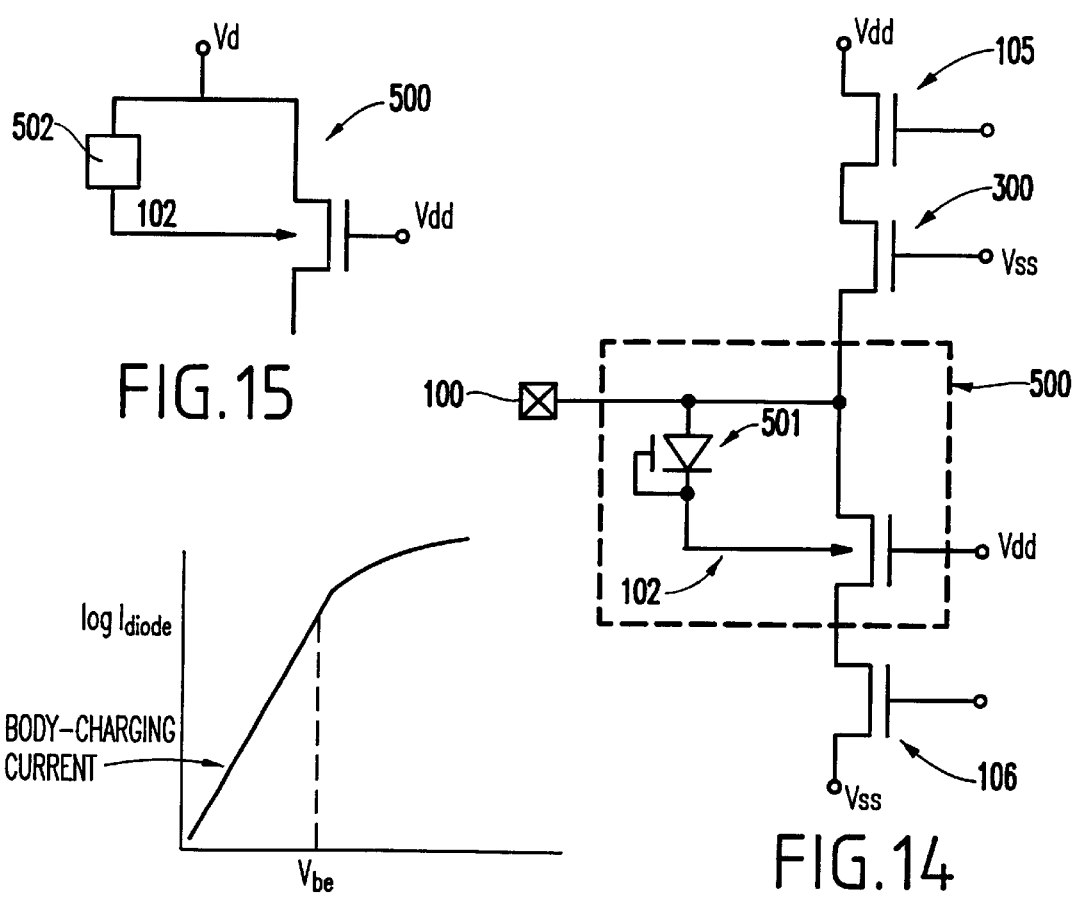
FIG.15
FIG.14
FIG.16

LOW POWER SOI ESD BUFFER DRIVER NETWORKS HAVING DYNAMIC THRESHOLD MOSFETS

BACKGROUND OF THE INVENTION

1. Field of the Invention

The invention generally relates to transistor devices which have a dynamic threshold and more particularly to a dynamic threshold device which has increased current capabilities.

2. Description of the Related Art

Silicon-On-Insulator (SOI) technology, which is becoming of increasing importance in the field of integrated circuits, deals with the formation of transistors in a relatively thin layer of semiconductor material overlying a layer of insulating material. Devices formed on SOI offer many advantages over their bulk counterparts, including: higher performance, absence of latch-up, higher packing density, low voltage applications, etc. However, SOI circuits, like other electronic circuits, are: First, susceptible to electrostatic discharge (ESD), a surge in voltage (negative or positive) that occurs when a large amount of current is applied to the circuit; and second, in need of providing an ideality (a constant voltage swing of 60 mV/decade over several decades of current) for analog applications, such as in phase-locked-loop circuits, voltage regulators, and band gap reference circuits.

To discharge ESD impulses, ESD protection schemes need a low voltage turn-on and a high current drive (the ability to generate or sink a large amount of current before a large amount of negative or positive voltage is developed). Traditional bulk overvoltage protection schemes, such as diode circuits, do not work well on SOI because of the presence of the SOI buried oxide. That is, conventional diodes on SOI have small current drivability because the current is carried laterally and is limited by the thickness of the semiconductor material. Thus, developing a new approach or a new type of diode was necessary for adequate ESD protection for SOI circuits.

ESD robustness is also important for SOI driver (buffer) and receiver circuits. Receiver circuits, pass transistors, test transistors, feedback keeper elements and other auxiliary transistors on input pins must be overvoltage tolerant to protect from ESD events, electrical overstress, and other high current and voltage conditions. Hence, robust elements are needed to provide ESD robust SOI receive circuits.

For I/O networks, off-chip drivers must also provide ESD robust pull-up and pull down elements. Hence, n-channel or p-channel SOS transistors, used as both pull-up or pull-down elements must provide over shoot and undershoot protection, electrical overstress protection and ESD protection.

The invention provides a dynamic threshold device which is useful for more than just diodic functions. For example, as explained in greater detail below, the invention can act as a lower trigger device with extremely high current loads to provide excellent ESD protection.

SUMMARY OF THE INVENTION

In one aspect, the invention provides a structure, method and apparatus which uses a body-charging element in receiver and I/O driver circuits, peripheral circuits, and core circuitry in an SOI chip. The invention uses an SOI body-limiting element in receiver and I/O driver circuits, peripheral circuits, and core circuitry to provide a more robust network from overvoltage and electrical overstress in an SOI chip.

In addition, the invention provides a structure, method and apparatus which uses an SOI body-augmenting network which modulates the SOI body potential and provides an alternative current path in a SOI receive and driver network for peripheral circuits and core circuitry to provide a more robust network. The invention also uses a SOI polysilicon-gated lateral undirectional unipolar bipolar transistor (Lubistor) as a body-charging element network for an SOI MOSFET. The invention also uses an SOI body- and gate-coupled SOS MOSFET as a body charging element network.

In addition, the invention provides a structure, method and apparatus which uses an SOI Lubistor elements for a body-reference network. The invention includes an SOI body- and gate-coupled MOSFET network for a body-modulation network and provides electrostatic discharge protection of SOI circuitry. The invention also provides a means for electrical overstress (EOS), electrostatic discharge (ESD), undershoot and overshoot protection to receiver, I/O driver and peripheral or core-circuitry for SOI circuitry. The invention uses a reference control network for SOI body potential modulation for receiver and I/O driver peripheral or core circuitry, for improved electrostatic discharge robustness of receiver and I/O drive peripheral circuitry and core circuitry.

Thus, the invention provides a structure and method for a body coupled driver circuit which includes a pull-up stage having a first transistor, and a pull-down stage having a second transistor (the first transistor and the second transistor have bodies coupled to one of a reference voltage and a pad node). The bodies of the first transistor and the second transistor are connected to one of the reference voltage and the pad node via a network. The network includes resistors in series, resistive transistors, lateral diodes, dynamic threshold transistors, a body charging element, and a body limiting transistor.

Another embodiment of the invention is a silicon-on-insulator (SOI) metal oxide silicon field effect transistor (MOSFET) device which includes a source, drain, body, and circuit control network connected between the drain and the source (the circuit control network controls a potential voltage of the body and provides overvoltage protection to the SOI MOSFET device). The circuit control network provides a parallel current path to the SOI MOSFET device, establishes the parallel current path, and charges the body of the SOI MOSFET device. The circuit control network includes a body-limiting element. The circuit control network includes at least one resistor element between the drain and the body, a second resistor element connected between the source and the body, at least one SOI lateral polysilicon gated undirectional bipolar transistor (Lubistor) device between the drain and the body, a second SOI lateral polysilicon undirectional bipolar transistor (Lubistor) connected between the body and the source, at least one SOI body-, gate-, and drain-coupled dynamic threshold MOSFET in a diode configuration between the drain and the body, and a second SOI body-, drain-, and gate-coupled SOI dynamic threshold MOSFET in diode configuration connected between the body and the source.

The device further includes at least one secondary SOI MOSFET between the drain and the body and a third SOI MOSFET connected between the body and the source. The device further includes an input pad connected to the drain, an inverter input connected to the source, the device forming a half-pass transistor for a receiver network, and an input pad connected to the drain and a substrate connected to the drain, the device forming a pull-down element. The device can be gunning transistor logic (GTL) I/O driver. The device can further include an input pad connected to the source, a Vdd power supply connected to the drain, an n-channel SOI device connected between the input pad and the Vdd power supply, an input pad connected to the body, a second SOI MOSFET connected to the source, and a power supply voltage connected to the source. The device can form a pull-down network. The SOI MOSFET and second SOI MOSFET include p-channel transistors and the device further includes a chip substrate. The device can form a mixed voltage CMOS I/O driver. The device further includes an n-channel pull-down transistor, Vdd power supply connected to the n-channel pull-down transistor, first p-channel pull-up transistor forming a second control network, and a chip substrate connected to the p-channel pull-up transistor. The circuit control network controls a body potential of the first n-channel pull-down transistor. The p-channel pull-up transistor is connected to Vss. The circuit control network charges the body and limits the voltage of the body to a set reference voltage and charges the body. The device further includes a plurality of resistors, second SOI MOSFETs, SOI Lubistors, and SOI body-and-gate-coupled SOI diodes in one of a parallel and a series configuration connected to the drain and the source to modulate a potential of the body and provide a second current path parallel to the SOI MOSFET device. The device further includes a capacitor and control elements connected to one of the body and the gate for triggering the SOI MOSFET.

BRIEF DESCRIPTION OF THE DRAWINGS

The foregoing and other objects, aspects and advantages will be better understood from the following detailed description of preferred embodiments of the invention with reference to the drawings, in which:

FIG. 12 is a schematic diagram of the current flow within element 400 in FIG. 11;

FIG. 13 is a graph of the threshold voltage and body voltage of item 400 in FIG. 11;

FIG. 14 is a schematic diagram of a body charging element;

FIG. 15 is a schematic diagram of an alternative to item 500 in FIG. 14;

FIG. 16 is a graph of the body charging current of the structure in FIG. 14;

DETAILED DESCRIPTION OF PREFERRED EMBODIMENTS OF THE INVENTION

As mentioned above, ESD protection is becoming increasingly important in current technologies. Convention ESD protection devices can be destroyed if there are forced to accept excessive current. The invention described below allows the body to be tied to ground through the use of a network placed between the body and the ground. Therefore, the invention provides an ESD device which sinks substantially more current than the conventional devices.

Using the dynamic threshold concepts explained above, the threshold voltage of a transistor can be reduced by letting the body of the transistor rise. The invention uses the drop of the threshold voltage to provide a higher current drive and greater ESD robustness or ESD current drive.

One approach to solving the aforementioned problems, mentioned in U.S. Pat. No. 5,811,857 to Assaderaghi et al. (hereinafter Assaderaghi) which is incorporated herein by reference, discloses a body-coupled gated (B/G-C) diode formed from an (SOI) field-effect transistor (FET). In this structure, the body, gate and drain of the SOI FET are tied together, forming the first terminal of the B/G-C diode. The source of the SOI FET forms the second terminal of the B/G-C diode. Both NFETs and PFETs may be used to create the forward-biased operation of the BIG-C diode.

However, the device disclosed in Assaderaghi is limited to operating in a diodic mode. Assaderaghi is an example of an application of a dynamic threshold technique applied to a SOI MOSFET and configures as a diode. To the contrary, the invention utilizes body-coupled devices in a wide variety of circuit structures.

Figure 1:
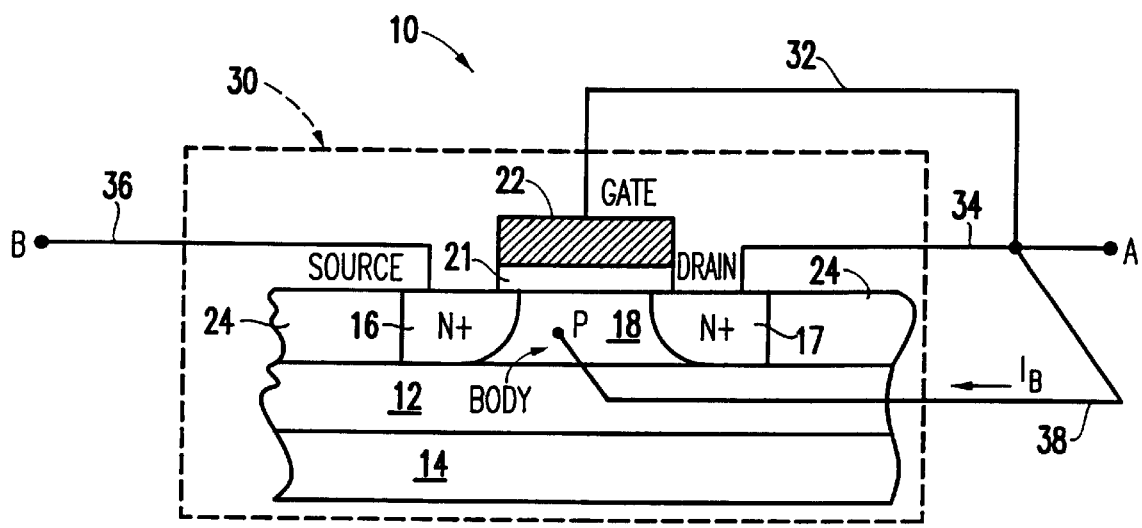
FIG. 1 is a schematic diagram of a body-coupled gated diode.

One configuration of a B/G-C diode is shown in FIG. 1. More specifically, FIG. 1 illustrates an NFET B/G-C diode 10 that is formed from an SOI MOSFET 30 having an isolation region 24, buried oxide 12, and silicon substrate 14. Two N+ regions are formed, a source region 16 and a drain region 17, on a P-type body region 18. A gate electrode 22 overlies a gate insulator 21 and defines the gate of the MOSFET 30. A surface channel 23 lies below gate insulator 21 and on the surface of the P-type region 18, wherein the P-type region is also known as the channel. The source 36, drain 34, body 38 and gate 32 terminals are affixed to the source region 16, drain region 17, body node region 18 and gate electrode 22, respectively. Terminal A, coupled to the body 38, drain 34, and gate 32 terminals, and terminal B, coupled to the source terminal 36, form the input and output of an N+/P type B/G-C diode 10. Although not shown, the connections of the terminals can be easily done at any of the metal layers of MOSFET 30.

Figure 2:
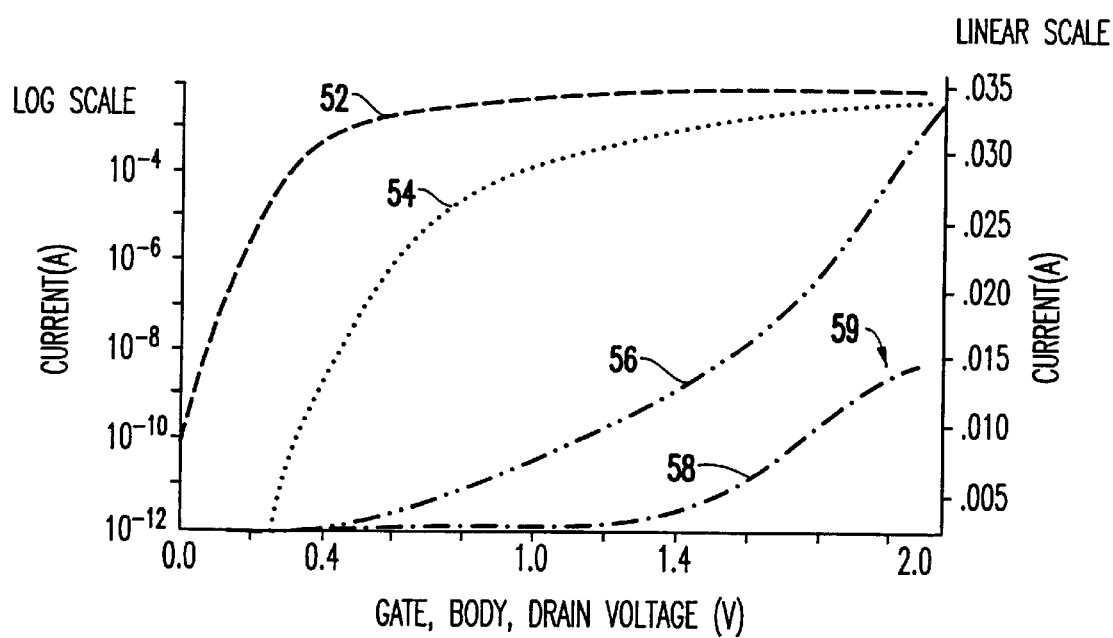
FIG. 2 is a graph of the measured characteristics of the voltage vs. the current in the structure shown in FIG. 1.

The operation of the MOSFET B/G-C diode shown in FIG. 1 takes place in two current regions, as illustrated in greater detail in FIG. 2. In the first current region, the B/G-C diode provides ideal diode characteristics. In the second current region, the B/G-C diode provides ESD protection. In general, the first current region of the BIG-C diode corresponds to the functional voltage range from approximately 0 volts to approximately Vdd, wherein Vdd is the power supply voltage. The exponential portion of diode characteristics, though, is typically limited to zero to approximately +/−0.7 volts because of external and parasitic series resistances. The second current region of the B/G-C diode corresponds to the range approximately below zero and above the power supply voltage, Vdd.

For the second current region, ESD protection is provided under two turn-on conditions of the MOSFET B/G-C diode. The first turn-on condition occurs when the voltage of the body 38 exceeds the voltage of the source 36. When this condition occurs, a forward-biased diode attribute allows a current flow from the body terminal to the source terminal.

The second turn-on condition occurs when the voltage at the gate 32 exceeds the threshold voltage. That is, as the signal pad voltage increases, the body voltage and the gate voltage will also increase. When the body voltage increases, the threshold voltage decreases. Thus, when the gate voltage exceeds the threshold voltage, current will flow from the drain terminal to the source terminal.

Thus, for the NFET B/G-C diode 10 (FIG. 1), when a positive pulse is applied to the terminal of the NFET (terminal A), the current is discharged through the P-N diode formed by the body 18 and drain 16 of the NFET structure. In parallel, as the body voltage increases, the threshold voltage of the MOSFET 30 decreases, creating a dynamic threshold and ideal diode characteristics. As the threshold voltage of the NFET decreases, the gate-coupling of the NFET turns on the NFET in parallel with the diode. A unique aspect of the B/G-C diode is the parallel operation of diode characteristic of the diode and the body and gate coupled MOSFET interaction. The B/G-C diode uses body-coupling to lower the absolute value of the threshold voltage and gate-coupling to turn on the ESD MOSFET element prior to NFET snapback.

Likewise, for a PFET B/G-C diode which is also illustrated and discussed in Assaderaghi, when a negative pulse is applied to the terminal of the PFET (terminal A), the current is discharged through the N-P diode formed by the body and drain of the PFET structure. In parallel, as the body voltage decreases, the magnitude of the threshold voltage of the PFET decreases, again creating a dynamic threshold and ideal diode characteristics. As the threshold voltage of the PFET decreases, the gate-coupling of the PFET turns on the PFET in parallel with the diode.

A distinguishing aspect of the B/G-C diode as compared to other diodes is the parallel operation of diodic characteristic of the diode and the body 25 and gate coupled MOSFET interaction. That is, the B/G-C diode uses body-coupling to lower the absolute value of the threshold voltage and gate-coupling to turn on the ESD MOSFET element prior to FET snapback.

FIG. 2 illustrates the operation of the NMOSFET B/G-C diode 10 (lines 52 and 56) compared to the operation of a non-BIG-C diode (lines 54 and 58). On the left vertical axis of the graph is a log scale of the current at the first current region (pertaining to lines 52 and 54), indicating the subthreshold regions of MOSFET 30 (line 52) and the FET of the non-B/G-C diode (line 54). The other vertical axis of the graph illustrates the linear scale of the current at the second current region (pertaining to lines 56 and 58), indicating the ESD operational mode of MOSFET 30 (line 56) and the FET of the non-B/G-C diode (line 58).

At the first current region, the BIG-C diode (line 52), unlike the non-B/G-C diode (line 54), attains an ideal subthreshold swing of 60 mV/decade. This identity is possible through the coupling of the body to the gate of MOSFET 30. That is, the gate voltage is directly applied to the body instead of being capacitively coupled, as with the conventional non-B/G-C diode.

The B/G-C diode, with an identity factor of 1, produces a 60 mV/decade slope (line 52), and the non-B/G-C diode, with an identity factor of approximately 1.45, produces a slope of around 87 mV/decade (line 54). As aforementioned, a 60 mV/decade slope is important in analog applications for functions such as voltage reference, phase-locked-loop, and voltage regulators.

At the second current region (lines 56 and 58), the ESD protection provided by the non-B/G-C (line 58) diode is minimal, quickly being dominated by series resistance 59, where the voltage begins to increment proportionally to the current. The ESD protection provided by the B/G-C diode is much greater (line 56). The BIG-C MOSFET at this point may be conceptually treated as a bipolar device with large (and sometimes infinite) current gain. The drain current can be modeled as the collector current, and the body (gate) current as the base current. Even though for ease of analysis this device may be treated as a bipolar device, it is indeed a MOSFET since the current conduction is through the surface channel and is controlled by the gate. The "apparent" gain of the "bipolar" device is large, because the threshold voltage (Vt) of the MOSFET is being modulated by the applied bias to the silicon film. This gives the appearance of large bipolar gain at low biases.

Figure 3:
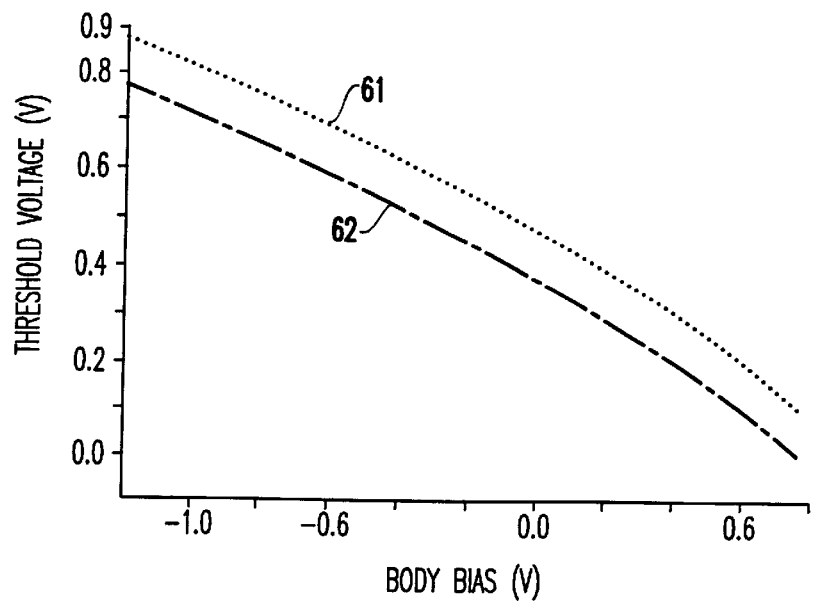
FIG. 3 is a graph of the characteristics of the threshold voltage vs. the body bias of the structure shown in FIG. 1.

FIG. 3 demonstrates the modulation of the threshold voltage by the applied body bias. The modulation of two devices is depicted. One of the devices has a shorter channel length than the other. Line 61 illustrates when $L_{drawn}$, the drawn dimensions of the channel length, is equal to 0.25 $\mu$m, and line 62 illustrates when $L_{drawn}$ is equal to 0.20 $\mu$n. Thus, the B/G-C diode uses body-coupling to lower the absolute value of the threshold voltage and create a dynamic threshold. Consequently, control of the threshold voltage allows for excellent control of the diode characteristics. Furthermore, by changing Vt-adjust implants (implants that are utilized to control the threshold voltage) of a MOSFET, the Ioff the B/G-C diode (e.g., Ioff of the MOSFET) can easily be changed by several orders of magnitude. This change is depicted by moving line 52 to the left or right, which is not easily accomplished in regular diodes.

Carrying the bipolar analogy one step further, it becomes clear why connecting the collector and base together will form a diode. Here, the gate and the body may form the base terminal, the drain may be the collector terminal, and the source may be the emitter terminal. Even though the base (gate) current might have non-identity, its sum with the collector current will remain ideal because the collector current is several orders of magnitude larger than the base current. As seen, this diode will have a much larger current than the conventional diode of the same size.

As mentioned above, the conventional dynamic threshold devices are limited in the amount of current they can sink because the body of the transistor cannot be tied to ground. The invention allows the body to be tied to ground (or the pad) through the use of a network placed between the body and the ground (or the pad). Therefore, the invention provides an ESD device which sinks substantially more current than the conventional devices.

With the conventional driver circuits, a tradeoff exists with respect to the threshold voltage used with the pull-up and pull-down transistors. More specifically, a high threshold device limits the current drive. When the operating voltage VDD is close to the threshold voltage VT and the body is grounded (Vsub=0.0 Volts), there is reduced current flow. Conversely, a low threshold device (which increases current flow) may suffer from excessive hot electron migration which may damage or reduce the effectiveness of the transistor. Therefore, there is a need for a device which has a variable threshold to provide the proper balance of this tradeoff, but which is capable of handling high current loads.

With the invention, the tradeoff of the hot electron stress reduction vs. current drive can be set to optimize the driver performance or the driver reliability. Therefore, depending on the application, it is possible to set the driver current gain by lowering the threshold voltage through the body.

Figure 4:
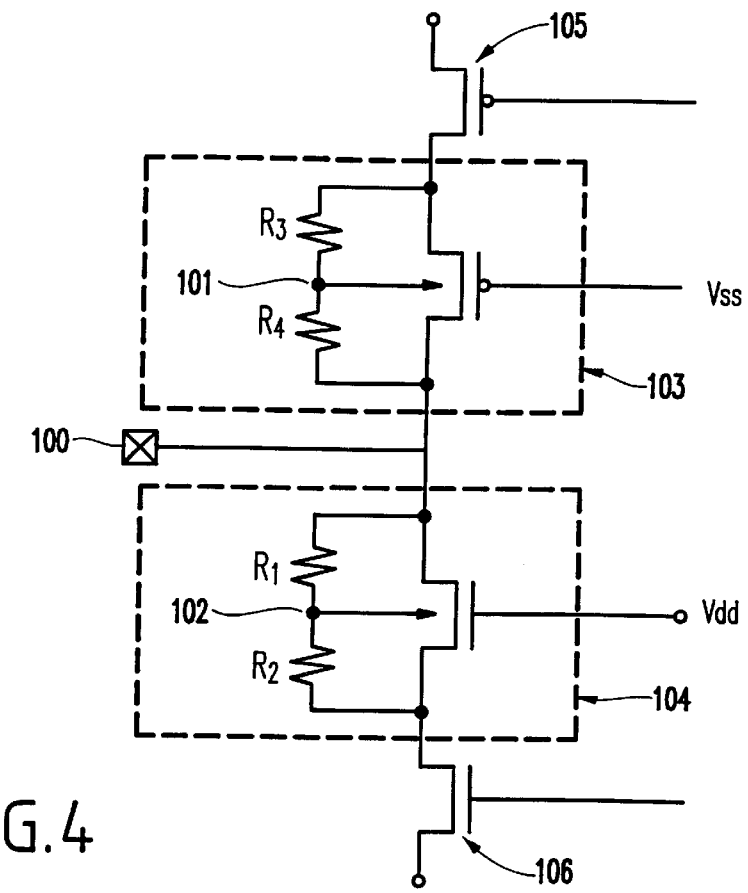
FIG. 4 is schematic diagram of a first network using NFET implementation.

FIG. 4 illustrates a body coupled driver that includes a first PFET pull-up transistor 103 in series with a second PFET pull-up transistor 105. The structure also includes complementarity second NFET pull-down transistors 104, 106. The bodies 102, 101 of the first pull-up transistor 103 and the first pull-down transistor 104 are connected to the pad 100 by way of a resistive network $R_1$–$R_4$. Since the bodies 101, 102 of the first transistors 103, 104 are tied to the pad node 100, the body and gate are set and adjusted through the reference voltage circuit $R_1$–$R_4$.

Figure 5:
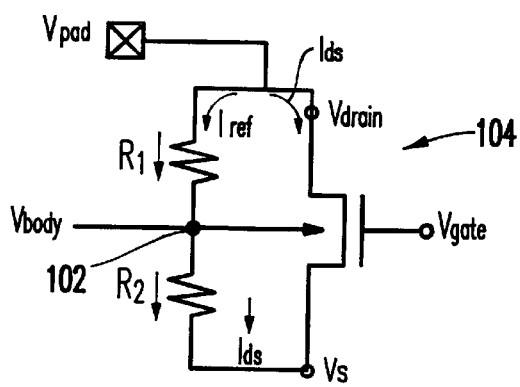
FIG. 5 is schematic diagram of the current flow within element 104 in FIG. 4.

As shown in FIG. 5, as $V_{pad}$ rises, $V_{pad}$=$V_{drain}$. Current $I_{ds}$ flows through the MOSFET 104 between $V_{drain}$ and $V_s$ and current $I_{ref}$ flows through the reference $I_{ds}$ circuit. $I_{ds} \cong f(V_{gate} - V_T(V_{body}))$. Hence, as the body potential changes, $I_{ds}$ changes.

$$V_{body} = \frac{R_2}{R_1 + R_2}(V_d - V_s)$$

hence $$I_{ds} \cong \left(V_{gate} - V\tau f\left(\frac{R_2}{R_1 + R_2}(V_d - V_s)\right)\right)$$

Having the local referencing network $R_1$–$R_4$ provides an alternative current path and simultaneously acts as a reference control for the body voltage. Since the current path extends to ground, an alternative path has been created to discharge current. If the path does not extend to ground, but to the second MOSFET 106, then the current will at least bypass the first MOSFET element 104.

Figure 6:
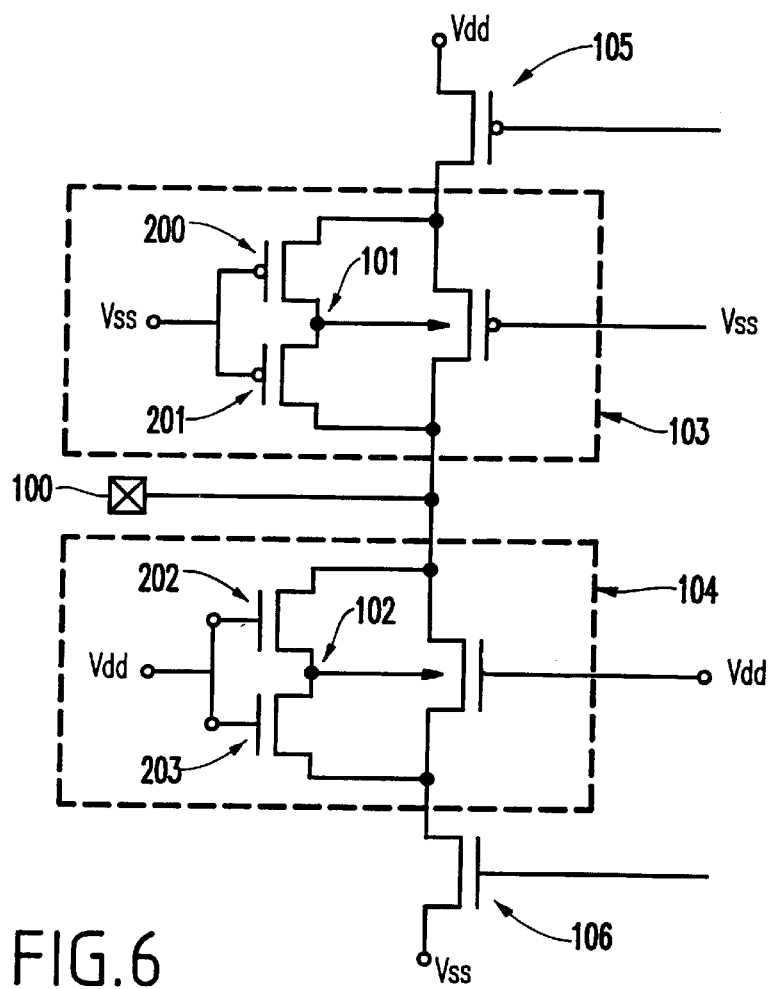
FIG. 6 is a schematic diagram of a network using PFET devices.

FIG. 6 illustrates another embodiment of the invention which is similar to FIG. 4 in that pull-up and pull-down transistors 103, 104 have body coupled gates. However, the network connected to the bodies 101, 102 comprises PFET resistor elements 200, 201 and NFET resistor elements 202, 203. Elements 202 and 203 are SOI-MOSFET transistors. Element 202 and 203 are both "on" and the body voltage, $V_{body}$, at node 102 is set as $$V_{body} \cong \frac{(R_{on})_2}{(R_{on})_1 + (R_{on})_2} V_{ds}$$

where $(R_{on})_1$ is the dynamic on-resistance of SOI MOSFET 202 and $(R_{on})_2$ is the dynamic on-resistance of transistor 203.

Figure 7:
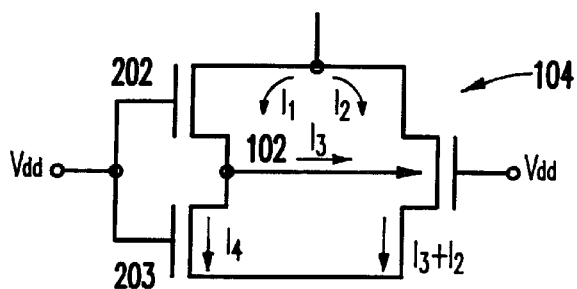
FIG. 7 is a schematic diagram of the current flow within element 104 in FIG. 6.

As shown in FIG. 7, current 11 flows through element 202 and current $I_2$ flows through the MOSFET 104. Current $I_3$ flows through body node 102, charging the body and raising the body voltage.

Figure 8:
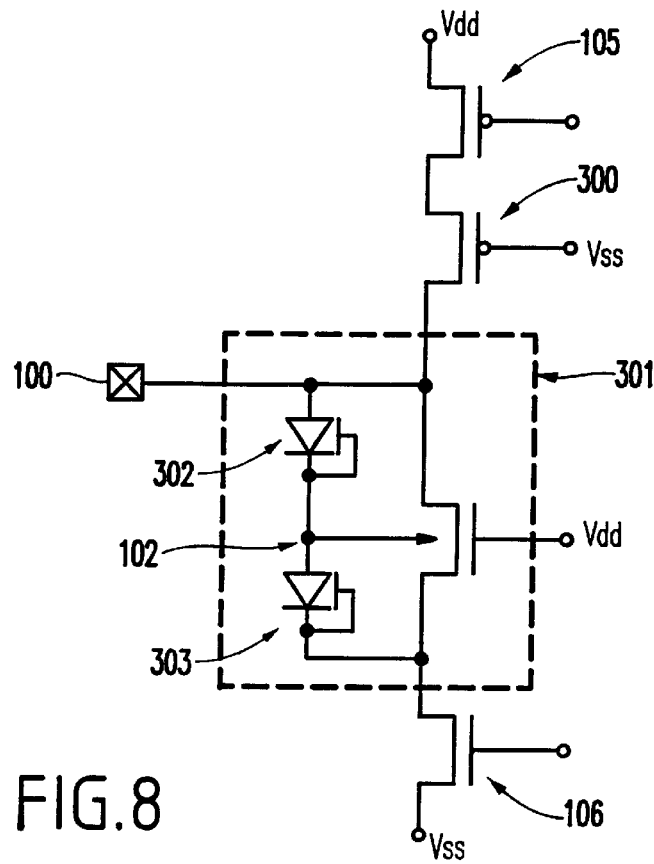
FIG. 8 is a schematic diagram of a polysilicon-bound diode body reference network.
Figure 9:
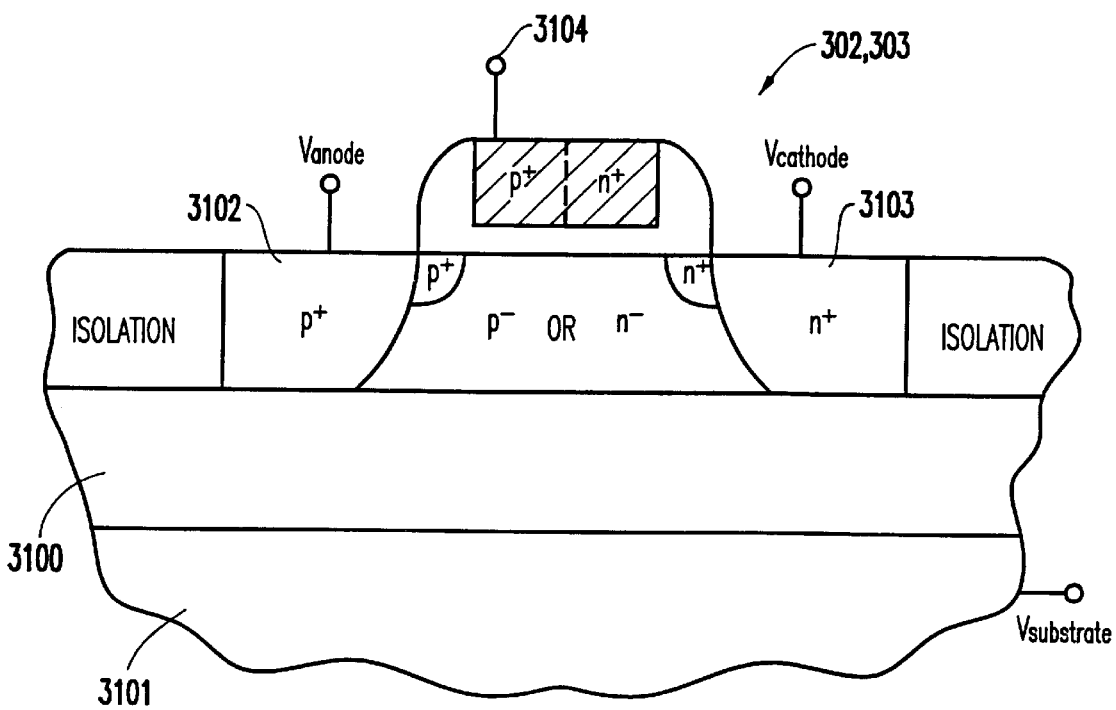
FIG. 9 is a schematic diagram of a Lubistor.

FIG. 8 illustrates the next embodiment of the invention which is similar to the structure illustrated in FIG. 4 except for the following differences. The body coupled pull-up transistor 103 is replaced with a conventional PFET transistor 300 and the first pull-down transistor 301 includes a body coupled network of lateral SOI diodes 302, 303 coupled to the body 102. The diodes 302, 303 are SOI lateral unidirectional bipolar transistors (known also as SOI Lubistors) as shown in FIG. 9 and include a p+ anode 3102, a n+ cathode 3103, a buried oxide 3100, and a substrate 3101. The Lubistor has a diodic turn-on.

Figure 10:
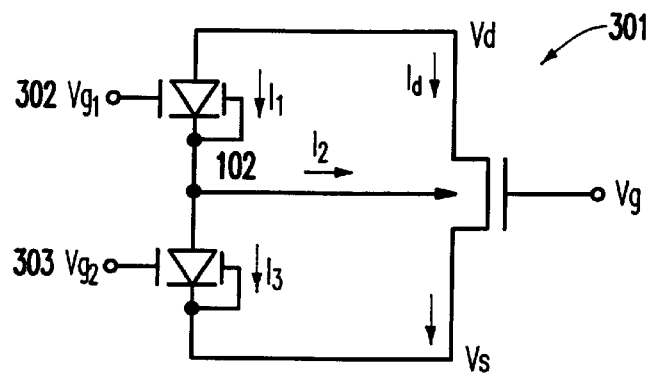
FIG. 10 is a schematic diagram of the current flow within element 301 in FIG. 8.

As shown in FIG. 10, the body potential $V_{body}$ at node 102 between diodes 302, 303 can be expressed as $$V_{body}=V_d-V_{be1}(V_{g1})$$

and $$V_{body}=V_s-V_{be2}(V_{g2})$$

wherein $V_{be1}$ is forward voltage of diode 1, and $V_{be2}$ is forward voltage of diode 2.

The gate of the Lubistor 3104 can be set at Vdd, or connected to the cathode 3103, or an alternate reference voltage. Hence, the current $I_1$ shown in FIG. 10 flows through the diode 302 when the voltage between the source and drain $V_{ds}$ exceeds $V_{be1}(V_{g1})+V_{be2}(V_{g2})$ when $V_{ds}>V_{be1}(V_{g1})+V_{be2}(V_{g2})$ then current flows through element 302 and 303.

At this point, the body voltage 102 rises and $I_{ds}$=f($V_g$–$V_T(V_d-V_{be1})$). Additionally, the current $I_1$, flows through the diode 302 where $I_2$ flows to charge the body 102, and current $I_3$ flows through the element 303. Hence the total current $I_d+I_1$ flow through the device 301.

FIG. 8 is distinguished from FIGS. 4 and 6 in that, in FIG. 8, the body reference 102 has a fixed turn-on voltage set at ($V_{be1}+V_{be2}$), allowing diodic current flow for improved ESD robustness, and is controlled by $V_{g1}$ and $V_{g2}$ for diode voltage modulation. While FIG. 8 shows gates connected to the cathode, the gates can be set at any potential.

The embodiment shown in FIG. 8 acts as a body charging solution, a body-voltage limiter and as an alternative current path. Another advantage of this embodiment is that SOI Lubistor diodes are more robust than resistor or MOSFET elements (e.g., 8V/$\mu$m ESD metric). Also as would be known by one ordinarily skilled in the art given this disclosure, in this embodiment (FIG. 8), elements 302 and 303 can be replaced by a plurality of diode elements in or parallel configuration.

Figure 11:
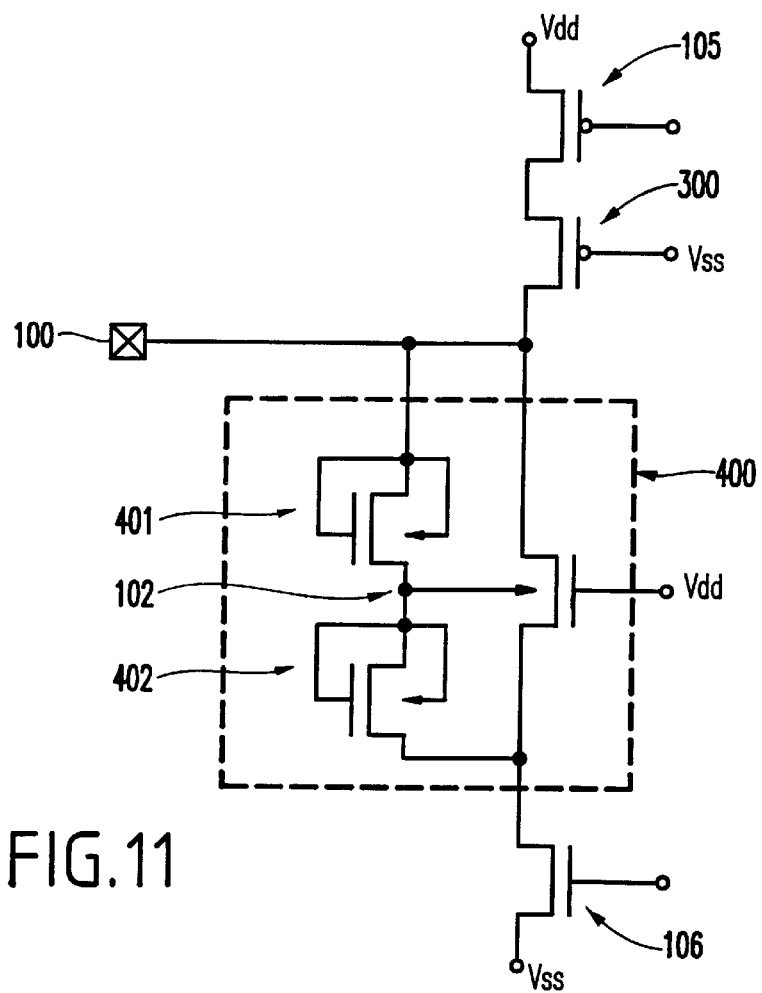
FIG. 11 is a schematic diagram of a dynamic threshold bridge-gate coupled reference network.

In a similar manner, FIG. 11 illustrates the next embodiment of the invention which is a variation on the previous structures. In FIG. 11, the first NFET pull-down transistor 400 includes dynamic threshold MOSFETS 401, 402. FIG. 11 shows an SOI-body reference control network using SOI dynamic threshold MOSFETS in an SOI driver circuit. Note that this can be shown for pull-down or pull-up elements (106, 105, and 300).

The MOSFETS 401, 402 have the body, drain and gate connected as shown in FIG. 1, forming an SOI body-and-gate-coupled dynamic threshold "diode" (or B/G-C SOI diode). As the drain voltage rises, the body, gate and drain of element 401 rise. Hence the body of element 401 rises, lowering the threshold voltage $V_T$ of element 401. As the body rises, the MOSFET 401 turns on below the forward voltage $V_{be}$ of the body-diode (see FIG. 13). Hence element 401 current drive consists of $I_{d401} \cong f(V_{g401}-V_T(V_d))$, where $I_{d401}$ is the current at the drain of element 401 and $V_{g401}$ is the voltage at the gate of element 401. Element 401 turns on providing current $I_2$ to drive the body 102 of the MOSFET 400 (see FIG. 12).

As the current $I_2$ flows, $V_{body}$ 102 rises turning on and improving current drive of the primary MOSFET 400. As voltage $V_{ds}$ increases, current flows through elements 401 and 402 setting the voltage set point of $V_{body}$ 102.

The advantage of the embodiment in FIG. 11 is that the reference network is even more ESD-robust compared to the SOI Lubistor elements. ESD experiments have shown ESD robustness exceeding 18.8 V/$\mu$m compared to 8 V/$\mu$m of SOI Lubistors. This embodiment also provides an alternative current path, body modulation, body-charging, and voltage limiting features, as discussed above. Again, as would be known by one ordinarily skilled in the art given this disclosure, elements 401 and 402 can be replaced by a plurality of body/gate-coupled (B/G-C) SOI diodes in series (or parallel) configuration.

FIG. 14 illustrates the next embodiment of the invention which is also a variation on the previous structures. In this embodiment, the first NFET pull-down transistor includes a body charging element 500. The embodiment of the invention, shown in FIG. 14, is similar to the previous embodiment and includes a single element 500 as the body-charging element. In this embodiment, the reference set point is partly set by the SOI polysilicon diode Lubistor element 501. As shown in FIG. 15, the invention can also utilize an SOI dynamic threshold-body-and-gate-coupled element or other elements as discussed above (e.g., resistor, MOSFET, etc.) 502, so long as element 502 acts as a body charging element. A key feature is that this embodiment does not utilize a second physical element but only the single element 502. As the drain voltage of element 500 increases, the SOI Lubistor element 501 turns on when $V_{be} > V_d - V_{body}$ ($V_{be}$). As the voltage of the drain $V_d$ increases, the body also begins to rise, and the SOI Lubistor diode 501 turns on, which charges the body of the element 500.

Figure 17:
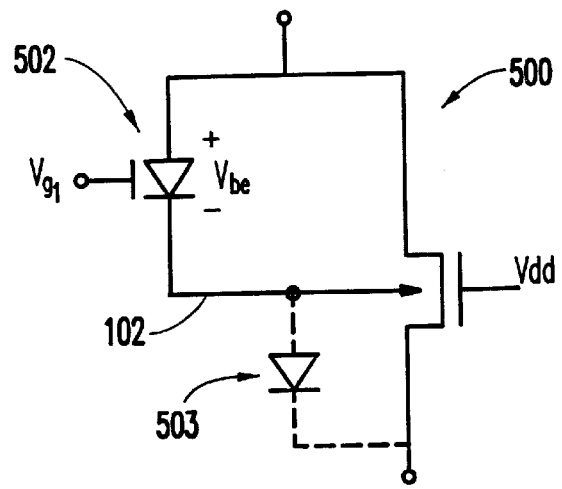
FIG. 17 is a schematic diagram of an alternative to item 500 in FIG. 14.

As shown in FIG. 16, the body voltage 102 rises until the body-to-source voltage exceeds $V_{be}$ across the parasitic diode of MOSFET 500. The voltage of body 102 is set by the body-charging element 502 and the parasitic diode 503 (e.g., body-to-source MOSFET) as shown in FIG. 17. Thus, $$V_{body(102)} = V_d - V_{be}(V_{g1})$$

and $$V_{body} = V_s + V_{be(500)}$$

The advantage of the structure shown in FIG. 14 over other embodiments is that only one additional element is used along with the parasitic body-to-source diode 502 of the MOSFET. This produces capacitance and space advantages. In this embodiment (e.g., FIG. 14), the B/G-C SOI diode can be substituted for an "on" SOI transistor. In the case of an SOI Lubistor diode, the voltage of the gate electrode can be tied to a reference voltage, Vdd, to the anode, cathode or even left floating. Also, the diode can be replaced by a string of Lubistors in series or parallel configuration.

Figure 18:
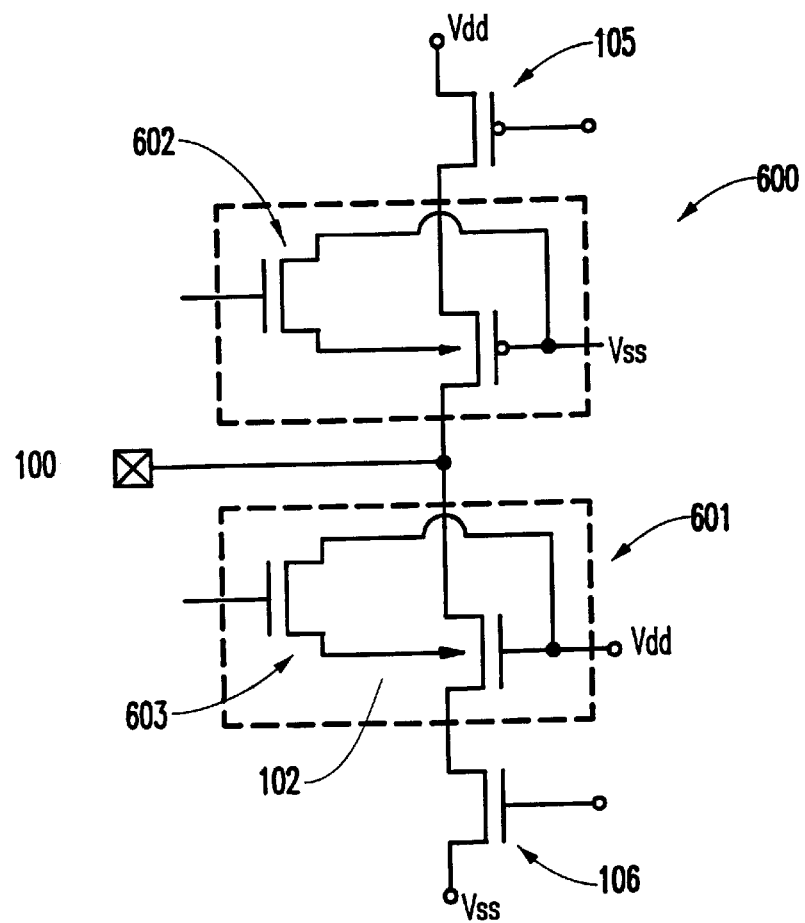
FIG. 18 is a schematic diagram of an input/output driver with body limiters.

FIG. 18 also illustrates another embodiment of the invention which is a variation on the previous structures. In this embodiment, the first PFET pull-up transistor 600 and the first NFET pull-down transistor 601 include body limiters 602, 603. A body-limiting device modulates the voltage of the body. As in the prior embodiments, in this embodiment, the body reference voltage can be de-coupled from the drain of the MOSFET. In FIG. 18, the body voltage of MOSFETs 600 and 601 are set to a reference voltage and do not connect to the input pad 100.

In this case, the element 603 can set the potential of the body when the MOSFET is turned "on" with control gate element 603. Element 603 can have a floating body or the body can be tied to its own drain or source. The potential of the body of element 601 is set by the gate voltage of 603 and the MOSFET width and length. In this embodiment, the reference voltage of the body 102 can be set using any plurality of control elements (Lubistor, string of Lubistors, B/G-C diodes, plurality of MOSFETs).

One advantage of the embodiment shown in FIG. 18 is that it provides body modulation, which produces more current drive. This implementation also couples to Vss or Vdd, which falls and rises from overshoot and the ESD phenomenon. It is distinguished from other embodiments in that it does not provide an "alternative current path" or redundant current path. It is also distinguished in that it is not triggered or biased by the input pad voltage, and hence is more suitable for mixed voltage or other applications.

In these embodiments, the I/O driver can have a single NFET pull-up or pull-down, a single NFET pull-down gunning transistor logic (GTL driver), single NFET pull-up and single PFET pull-up (SOI CMOS driver) or combination and permutations of pull-up and pull-dow-n elements. In the case of single NFET, the gate is not biased at Vdd but by pre-drive circuitry.

For receiver implementations, body-charging, body limiting and augmented devices can be used on pass transistors, or clamping elements commonly used in art.

The invention allows the body to be tied to ground (or the pad) through the use of a network placed between the body and the ground (or the pad). Therefore, the invention provides an ESD device which sinks substantially more current than the conventional devices.

While the invention has been described in terms of preferred embodiments, those skilled in the art will recognize that the invention can be practiced with modification within the spirit and scope of the appended claims.

What is claimed is:

1. A body coupled driver circuit comprising:
   a pull-up stage having a first transistor, said first transistor having a first body electrically coupled through direct-current (DC) carrying components and establishing a reference voltage when applying a potential at a pad node; and
   a pull-down stage having a second transistor, said second transistor having a second body electrically coupled through said DC carrying components and establishing said reference voltage through said pad node.

2. The body coupled driver in claim 1, wherein said first body and said second body are connected to one of said reference voltage and said pad node via said DC carrying components, said DC carrying component forming a network.

3. The body coupled driver in claim 2, wherein said network comprises resistors in series.

4. The body coupled driver in claim 2, wherein said network comprises resistive transistors.

5. The body coupled driver in claim 2, wherein said network comprises lateral diodes.

6. The body coupled driver in claim 2, wherein said network comprises dynamic threshold transistors.

7. The body coupled driver in claim 2, wherein said network comprises a body charging element.

8. The body coupled driver in claim 2, wherein said network comprises a body limiting transistor.

9. A silicon-on-insulator (SOI) metal oxide silicon field effect transistor (MOSFET) device having a substrate layer on a dielectric, said device comprising:
   a source;
   a drain opposite said source;
   a body between said source and said drain; and
   circuit control network, connected between said drain and said source through direct-current (DC) carrying components said circuit control network controlling a potential voltage of said body and providing overvoltage protection to said SOI MOSFET device,
   wherein said circuit control network comprises an alternative forward current conduction path from said drain to said source.

10. The device in claim 9, wherein said circuit control network provides a parallel current path to said SOI MOSFET device.

11. The device in claim 10, wherein said circuit control network establishes said parallel current path.

12. The device in claim 9, wherein said circuit control network charges said body of said SOI MOSFET device.

13. The device in claim 9, wherein said circuit control network comprises a body-limiting element.

14. The device in claim 9, wherein said circuit control network includes at least one resistor element b en said drain and said body.

15. The device in claim 14, wherein said circuit control network further includes a second resistor element connected between said source and said body.

16. The device in claim 9, wherein said circuit control network includes at least one SOI lateral polysilicon gated undirectional bipolar transistor (Lubistor) device connected between said drain and said body.

17. The device in claim 16, wherein said circuit control network further includes a second SOI lateral polysilicon undirectional bipolar transistor (Lubistor) connected between said body and said source.

18. The device in claim 9, wherein said circuit control network includes at least one SOI body-, gate-, and drain-coupled dynamic threshold MOSFET in a diode configuration between said drain and said body.

19. The device in claim 18, wherein said circuit control network further includes a second SOI body-, drain-, and gate-coupled SOI dynamic threshold MOSFET in diode configuration connected between said body and said source.

20. The device in claim 9, further comprising at least one secondary SOI MOSFET connected between said drain and said body.

21. The device in claim 20, further comprising a third SOI MOSFET connected between said body and said source.

22. The device in claim 9, further comprising:

an input pad connected to said drain; and a diode input connected to said source, said device forming a half-pass transistor for a receiver network.

23. The device in claim 9, further comprising an input pad connected to said drain and a substrate connected to said drain, said device forming a pull-down element.

24. The device in claim 22, wherein said device is a gunning transistor logic (GTL) E/O driver.

25. The device in claim 9, further comprising an input pad connected to said source and a Vdd power supply operatively connected to said drain.

26. The device in claim 23, further comprising an n-channel SOI device operatively connected between said input pad and a Vdd power supply.

27. The device in claim 9, further comprising:

an input pad operatively connected to said body;

a second SOI MOSFET connected to said source; and a power supply voltage operatively connected to said source, said device forming a pull-down network.

28. The device in claim 26, wherein said SOT MOSFET comprises a p-channel transistor and said device further includes a chip substrate.

29. The device in claim 24, wherein said device forms a mixed voltage CMOS I/O driver.

30. The device in claim 9, wherein said SOI MOSFET comprises an n-channel pull-down transistor of a driver circuit and wherein said driver circuit further comprises;

a Vdd power supply connected to said n-channel pull-down transistor;

a first p-channel pull-up transistor forming a second control network; and a chip substrate connected to said p-channel pull-up transistor.

31. The device in claim 30, wherein said circuit control network controls a body potential of said first n-channel pull-down transistor.

32. The device in claim 30, wherein said p-channel pull-up transistor is connected to Vss.

33. The device in claim 9, wherein said circuit control network charges said body.

34. The device in claim 9, wherein said circuit control network limits the voltage of said body to a set reference voltage and charges said body.

35. The device in claim 9, further comprising one of a plurality of resistors, second SOI MOSFETs, SOI Lubistors, and SOI body-and-gate-coupled SOI diodes in one of a parallel and a series configuration connected to said drain and said source to modulate a potential of said body and provide a second current path parallel to said SOI MOSFET device.

36. The device in claim 9, further comprising control elements connected to one of said body and said gate for triggering said SOI MOSFET.

* * * * *